United States Patent
Iwai et al.

(10) Patent No.: US 9,653,649 B2
(45) Date of Patent: May 16, 2017

(54) GALLIUM NITRIDE SUBSTRATES AND FUNCTIONAL DEVICES

(71) Applicant: NGK INSULATORS, LTD., Aichi-prefecture (JP)

(72) Inventors: Makoto Iwai, Kasugai (JP); Masahiro Sakai, Nagoya (JP); Katsuhiro Imai, Nagoya (JP); Yoshitaka Kuraoka, Okazaki (JP)

(73) Assignee: NGK INSULATORS, LTD., Aichi (JP)

( * ) Notice: Subject to any disclaimer, the term of this patent is extended or adjusted under 35 U.S.C. 154(b) by 0 days.

(21) Appl. No.: 14/923,598

(22) Filed: Oct. 27, 2015

(65) Prior Publication Data
US 2016/0049554 A1    Feb. 18, 2016

Related U.S. Application Data

(63) Continuation of application No. PCT/JP2014/082067, filed on Dec. 4, 2014.

(30) Foreign Application Priority Data

Dec. 5, 2013  (JP) .................................. 2013-251796

(51) Int. Cl.
*H01L 33/00* (2010.01)
*C30B 25/00* (2006.01)
(Continued)

(52) U.S. Cl.
CPC ................ *H01L 33/32* (2013.01); *C30B 9/10* (2013.01); *C30B 19/02* (2013.01); *C30B 29/406* (2013.01);
(Continued)

(58) Field of Classification Search
CPC ......... H01L 33/32; H01L 33/20; H01L 33/02; C30B 9/10; C30B 19/02; C30B 25/02; C30B 29/406
See application file for complete search history.

(56) References Cited

U.S. PATENT DOCUMENTS 6,468,882 B2 * 10/2002 Motoki .................... C30B 25/02
257/E21.131
7,351,347 B2 * 4/2008 Akita ...................... C30B 25/02
216/79
(Continued)

FOREIGN PATENT DOCUMENTS

JP    2009-212284 A    9/2009
JP    2012-211065 A    11/2012
(Continued)

OTHER PUBLICATIONS

International Preliminary Report on Patentability for PCT Patent App. No. PCT/JP2014/082067 (Jun. 16, 2016).
(Continued)

*Primary Examiner* — Nikolay Yushin
(74) *Attorney, Agent, or Firm* — Cermak Nakajima & McGowan LLP; Tomoko Nakajima (57) ABSTRACT

The maximum value of peak intensities of cathode luminescence of a wavelength corresponding to a band gap of gallium nitride and in a measured visual field of 0.1 mm×0.1 mm is 140 percent or higher of an average value of the peak intensities of the cathode luminescence, provided that the peak intensities of the cathode luminescence are measured on a surface of the gallium nitride substrate.

8 Claims, 9 Drawing Sheets

(51) Int. Cl.
*H01L 33/32* (2010.01)
*C30B 9/10* (2006.01)
*C30B 19/02* (2006.01)
*C30B 29/40* (2006.01)
*H01L 33/20* (2010.01)
*C30B 25/02* (2006.01)
*H01L 33/02* (2010.01)

(52) U.S. Cl.
CPC .............. *H01L 33/20* (2013.01); *C30B 25/02* (2013.01); *H01L 33/02* (2013.01)

(56) References Cited

U.S. PATENT DOCUMENTS

| | | | | |
|---|---|---|---|---|
| 8,686,396 B2* | 4/2014 | Khan | ................ | H01L 21/02433 257/13 |
| 8,946,772 B2* | 2/2015 | Okagawa | ............ | C23C 16/0236 257/190 |
| 9,041,004 B2 | 5/2015 | Iwai et al. | | |
| 2006/0228870 A1* | 10/2006 | Oshima | ................... | C30B 25/02 438/458 |
| 2010/0213436 A1* | 8/2010 | Khan | ................ | H01L 21/02433 257/13 |
| 2011/0163323 A1* | 7/2011 | Motoki | ................... | C30B 25/00 257/76 |
| 2012/0305933 A1* | 12/2012 | Nakahata | ................ | H01L 33/16 257/76 |
| 2013/0248820 A1 | 9/2013 | Yamamoto | | |
| 2013/0256743 A1* | 10/2013 | Okuno | ................ | H01L 29/2003 257/103 |

FOREIGN PATENT DOCUMENTS

| | | |
|---|---|---|
| JP | 2013-010681 A | 1/2013 |
| JP | WO2013/022122 A1 | 2/2013 |
| JP | 2013-201326 A | 10/2013 |

OTHER PUBLICATIONS

International Search Report and Written Opinion for PCT Patent App. No. PCT/JP2014/082067 (Mar. 3, 2015) with English translation of the Search Report.

* cited by examiner

GALLIUM NITRIDE SUBSTRATES AND FUNCTIONAL DEVICES

TECHNICAL FIELD

The present invention relates to a gallium nitride substrate and a functional device.

RELATED ART STATEMENT

Recently, it has been extensively studied to use a nitride of a group 13 element, such as gallium nitride, to produce a semiconductor device such as a blue light LED, white light LED, blue-violet semiconductor laser or the like and to apply such semiconductor device to various kinds of electronic appliances.

Flux method is a kind of liquid phase process. In the case of gallium nitride, by using sodium metal as flux, it is possible to reduce a temperature and pressure required for crystal growth of gallium nitride to about 800° C. and several MPa, respectively. Specifically, nitrogen gas is dissolved into mixed melt of sodium metal and gallium metal, so that gallium nitride becomes supersaturation state and grows as a crystal. According to such liquid phase process, dislocations are reduced than that in the case of vapor phase process, so that it is possible to obtain gallium nitride of high quality and having a lower dislocation density.

The applicant filed patent document 1 as a method of producing a GaN template utilizing Na flux method.

Further, patent document 2 proposed that it is measured deviation of peak intensities of cathode luminescence on a surface of a gallium nitride substrate and it is used a gallium nitride substrate having smaller deviation so as to prevent abnormal growth of an epitaxial film due to processing damage on the surface of the gallium nitride substrate.

PRIOR TECHNICAL DOCUMENTS

Patent Documents (Patent document 1) WO 2013/022122
(Patent document 2) Japanese patent publication No. 2013-010,681A

SUMMARY OF THE INVENTION

Based on the descriptions of the patent document 2, the inventors studied to reduce deviation of peak intensities of photoluminescence on a surface of a gallium nitride substrate as possible. However, as such gallium nitride substrate was produced and a light emitting structure is formed thereon, its luminous intensity actually obtained has a limit. As the light emitting device whose luminous intensity is lowered, a leak current was observed. That is, even in the case that the deviation of the peak intensities of photoluminescence on the surface of the gallium nitride substrate is reduced, it is proved that it does not necessarily mean the improvement of function of a functional device such as the light emitting device or the like and there is a limit.

An object of the present invention is to reduce distribution of property on a surface of a gallium nitride substrate and to reduce local concentration of defects so that function of a functional device structure provided on the gallium nitride substrate is improved.

The present invention provides a gallium nitride substrate, wherein the maximum value of peak intensities of cathode luminescence in a measured visual field of 0.1 mm×0.1 mm is 140 percent or higher of an average value of said peak intensities of said cathode luminescence, provided that said peak intensities of said cathode luminescence are of a wavelength corresponding to a band gap of gallium nitride and are measured on a surface of said gallium nitride substrate.

The present invention further provides a functional device comprising said gallium nitride substrate and a functional layer formed on said surface of said gallium nitride substrate and comprising a nitride of a group 13 element.

The present inventors studied the case that the luminous intensities was lowered, when deviation photoluminescence peak intensities on a surface of a gallium nitride substrate is reduced to obtain a uniform gallium nitride substrate and a light emitting device structure is formed thereon. That is, in the case that the microstructure of the surface of such gallium nitride substrate was observed by cathode luminescence, it was proved that the deviation of cathode luminescence peak intensities was small and the uniformity of the microstructure was superior.

The inventors further studied for preventing the local concentration of the defects in such gallium nitride substrate, and found that it was rather effective to provide deviation in the cathode luminescence peak intensities on the surface of the gallium nitride substrate.

Figure 9:
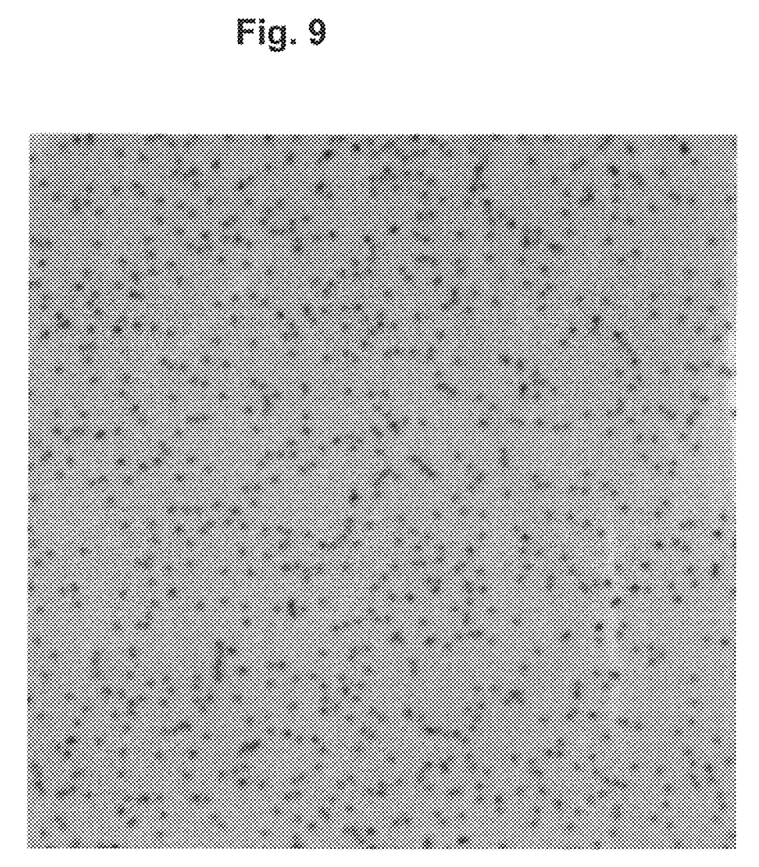
FIG. 9 is a photograph showing cathode luminescence image of the surface of the gallium nitride substrate in the comparative example.

That is, in the case that the deviation of photoluminescence peak intensities was reduced and the deviation of the cathode luminescence peak intensities was small as shown in a photograph of FIG. 9, for example, it was proved that the deterioration of the function due to local concentration of defects rather tends to occur. Contrary to this, in the case that deviation is provided in the cathode luminescence peak intensities as shown in a photograph of FIG. 5, for example, it was found that the deterioration of the function due to local concentration of the defects was prevented and the function was improved, to reach the present invention.

Besides, the idea of the invention is away from the idea of making the properties on the surface of the gallium nitride substrate uniform as described in the patent document 2.

That is, as the photoluminescence peak intensities at the wavelength corresponding to the band gap of gallium nitride were measured in each of the measurement regions each of 1 mm×1 mm in a measurement range on the surface of the gallium nitride substrate, the minimum value of the peak intensities of photoluminescence is 60 percent or lower and the maximum value is 120 percent or higher of an average value of the peak intensities of the photoluminescence in the whole measurement region. That is, as shown in examples, the maximum value of cathode luminescence (measured in 0.1 mm square) is 190, 160 and 140 percent of the average value, respectively. On the other hand, according to photoluminescence (measured in 1 mm square), the maximum value is as low as 140, 140 and 120 percent of the average value, respectively, indicating that the distribution of the peak intensities of photoluminescence was more uniform than the distribution of intensities of CL images.

EMBODIMENTS FOR CARRYING OUT THE INVENTION

Applications

The present invention may be used in technical fields requiring high quality, such as a blue LED with improved color rendering index and expected as a post luminescent lamp, a blue-violet laser for high-speed and high-density optical memory, a power device for an inverter for a hybrid car or the like.

Cathode Luminescence Peak Intensities

Cathode luminescence is to evaluate microscopic deviations on a surface of a gallium nitride substrate. According to the present invention, the cathode luminescence peak intensities of the wavelength corresponding to band gap of gallium nitride is measured at the surface of the gallium nitride substrate. Specifically, it is obtained a fluorescence microscopic image as described below.

System; BX61 or the like produced by Olympus Corporation
  Measurement conditions:
  Excitation filter: BP340-390 nm
  Absorption filter: BA420IF
  Dichroic mirror; DM410
  Visual field for observation: Object lens 5 fold and 20 fold
  Software: commercial image capture software (Adobe Photoshop, Image J or the like)

The distribution of the peak intensities are calculated from this fluorescence microscopic image by image analysis. That is, the fluorescence microscopic image is stored in a personal computer in non-compressed format (TIFF format). Further, the image is stored at a high pixel number of 1M pixel or higher. For removing measurement noises, smoothing function is used to perform smoothing one time. The smoothing treatment means the treatment that each pixel is replaced with an average value of adjacent pixels of 3 rows and 3 lines. The image is then converted based on 8 bit gray scale. That is, each pixel of the image is categorized into gradations of 0 to 255. The gradation of the peak intensities is read out by an intensity distribution function ("display range" is selected) of Image pro plus software of Media Sybernetics Corporation of the United States. Then, a ratio of an average gradation (Xave) and peak gradation (Xpeak) is calculated. The average gradation (Xave) is an average value of the cathode luminescence peak intensities and the peak gradation (Xpeak) is the maximum value of the cathode luminescence peak intensities.

The visual field for measuring the maximum and minimum values of the cathode luminescence peak intensities is made a square of 0.1 mm length×0.1 mm width.

According to the present invention, the maximum value of the cathode luminescence peak intensities (in the measurement visual field of 0.1 mm×0.1 mm), which is increased by defect reduction mechanism functioning effectively, is necessarily made 140 percent or higher, and may preferably be made 150 percent or higher, more preferably be made 170 percent or higher and most preferably be made 190 percent or higher, of the average value (in the measurement visual field) of the cathode luminescence peak intensities. Further, on the viewpoint of reducing the generation of macro defects, the maximum value of the cathode luminescence peak intensities may preferably be made 350 percent or lower, and more preferably be made 300 percent or lower, of the average value of the cathode luminescence peak intensities.

According to a preferred embodiment, the maximum value of the cathode luminescence peak intensities is 140 percent or higher of the average value of the cathode luminescence peak intensities in regions, which are island-shaped regions distributed on the surface of the gallium nitride substrate. It is preferred that such island-shaped regions are surrounded by continuous phase (matrix) having a lower peak intensity and are distributed in the continuous phase, respectively.

The shape of such island-shape region may preferably be a polygon such as hexagon, quadrilateral or the like, and more preferably be substantially hexagon or parallelogram.

It is further preferred that the maximum value of the cathode luminescence peak intensities is lower than 140 percent of the average value of the cathode luminescence peak intensities in a region, which is included in an outer profile of the island-shaped region. It is considered that such relatively dark region reflects the nuclei generated under the region. In the region, the maximum value of the cathode luminescence peak intensities may more preferably be 100 percent or lower of the average value.

According to a preferred embodiment, provided that photoluminescence peak intensities of the wavelength corresponding to the band gap of gallium nitride are measured in each of measurement regions each having a shape of a square of 1 mm×1 mm in a measurement range on the surface of the gallium nitride substrate, and provided that the measurement regions are continuous without spaces in the measurement range, wherein the maximum value of the photoluminescence peak intensities in the measurement region is 120 percent or higher of the average value. This shows that the surface of the gallium nitride substrate has relatively uniform properties in macroscopic view.

The maximum value of the photoluminescence peak intensities in the measurement region may preferably be 140 percent or higher of the average value in the measurement region of a square of 1 mm×1 mm in the measurement range on the surface of the gallium nitride substrate. Further, the maximum value of the photoluminescence peak intensities in the measurement region may preferably be 200 percent or lower of the average value in the measurement region of a square of 1 mm×1 mm in the measurement range on the surface of the gallium nitride substrate.

Further, on the viewpoint of preventing macroscopic deviations of the properties of the gallium nitride substrate, the minimum value of the photoluminescence peak intensities may preferably be 60 percent or lower, and more preferably be 45 percent or lower, of the average value, in the measurement region of a square of 1 mm×1 mm in the measurement range on the surface of the gallium nitride substrate. The minimum value of the photoluminescence peak intensities may preferably be 20 percent or higher of the average in the measurement region of a square of 1 mm×1 mm in the measurement range on the surface of the gallium nitride substrate.

Further, it is preferred that the measurement range of the photoluminescence peak intensities may preferably be a region excluding a region of a width of 2 mm from the periphery of the gallium nitride substrate. This is because deviations tends to occur in the peripheral region and such peripheral region is not used in many cases.

Figure 1A:
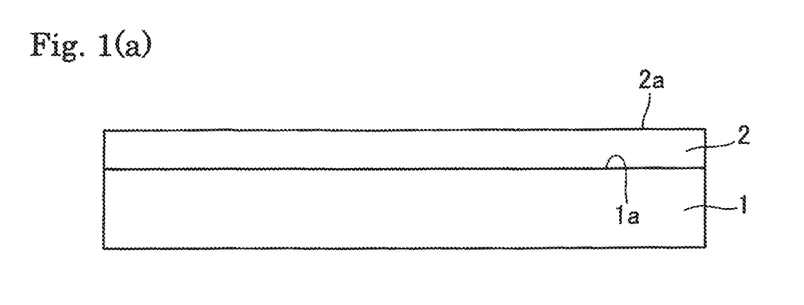
FIG. 1(a) is a view schematically showing a gallium nitride layer 2 formed on a seed crystal 1.
Figure 1B:
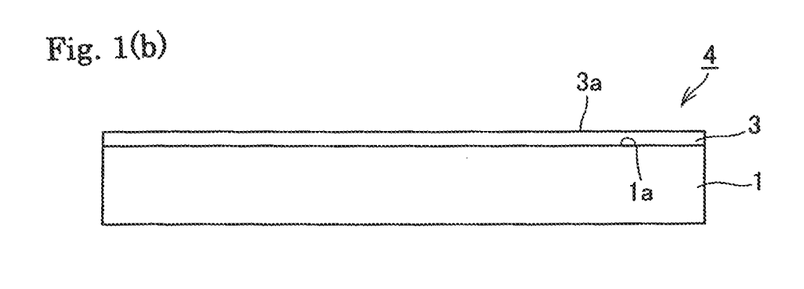
FIG. 1(b) is a view schematically showing a gallium nitride substrate 4.

According to a preferred embodiment, as shown in FIG. 1(a), a gallium nitride layer 2 is formed on a surface 1a of a seed crystal 1 composed of gallium nitride. Then, preferably, a surface 2a of the gallium nitride layer 2 is subjected to polishing so that a gallium nitride layer 3 is thinned as shown in FIG. 1(b) to obtain a gallium nitride substrate 4 of the present invention. 3a represents a surface after the polishing.

Figure 1C:
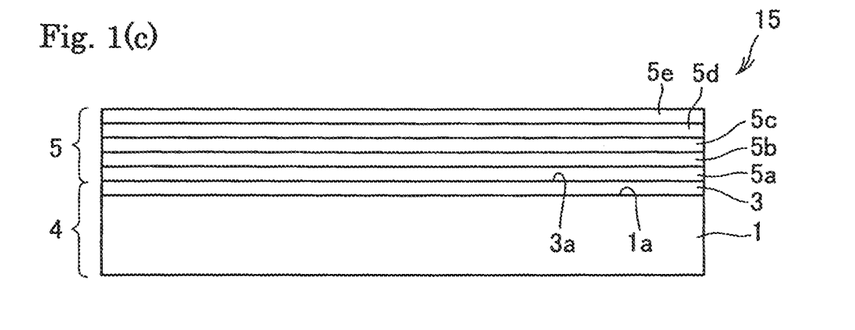
FIG. 1(c) is a view schematically showing a functional device 15 including a functional device structure 5 formed on the gallium nitride substrate 4.

A functional layer 5 is formed on the surface 3a of the thus obtained gallium nitride substrate 4 by vapor phase process to obtain a functional device 15 (FIG. 1(c)). Besides, 5a, 5b, 5c, 5d and 5e are epitaxial layers grown on the surface 3a and designed depending on application.

Seed Crystal

According to the present invention, the seed crystal is composed of gallium nitride crystal. The seed crystal may form a self-supporting substrate (supporting body) or may be a seed crystal film formed on a separate supporting body. The seed crystal film may be composed of a single layer or may include a buffer layer on the side of the supporting body.

The method of forming the seed crystal film may preferably be vapor phase process, and metal organic chemical vapor deposition (MOCVD) method, hydride vapor phase epitaxy (HYPE) method, pulse-excited deposition (PXD) method, MBE method and sublimation method are exemplified. Metal organic chemical vapor deposition method is most preferred. Further, the growth temperature may preferably be 950 to 1200° C.

In the case that the seed crystal film is formed on the supporting body, although the material forming the supporting body is not limited, it includes sapphire, AlN template, GaN template, self-supporting GaN substrate, silicon single crystal, SiC single crystal, MgO single crystal, spinel ($MgAl_2O_4$), $LiAlO_2$, $LiGaO_2$, and perovskite composite oxide such as $LaAlO_3$, $LaGaO_3$ or $NdGaO_3$ and SCAM ($ScAlMgO_4$). A cubic perovskite composite oxide represented by the composition formula $[A_{1-y}(Sr_{1-x}Ba_x)_y][(Al_{1-z}Ga_z)_{1-u}D_u]_3$ (wherein A is a rare earth element; D is one or more element selected from the group consisting of niobium and tantalum; y=0.3 to 0.98; x=0 to 1; z=0 to 1; u=0.15 to 0.49; and x+z=0.1 to 2) is also usable The direction of growth of the gallium nitride crystal layer may be a direction normal to c-plane of the wurtzite structure or a direction normal to each of the a-plane and m-plane.

The dislocation density at the surface of the seed crystal is preferably lower, on the viewpoint of reducing the dislocation density of the gallium nitride layer provided on the seed crystal. On the viewpoint, the dislocation density of the seed crystal layer may preferably be $7\times10^8$ cm$^{-2}$ or lower and more preferably be $5\times10^8$ cm$^{-2}$ or lower. Further, as the dislocation density of the seed crystal may preferably be lower on the viewpoint of the quality, the lower limit is not particularly provided, but it may generally be $5\times10^7$ cm$^{-2}$ or higher in many cases.

Gallium Nitride Layer

Although the method of producing the gallium nitride crystal layer is not particularly limited, it includes vapor phase process such as metal organic chemical vapor deposition (MOCVD) method, hydride vapor phase epitaxy (HVPE) method, pulse-excited deposition (PXD) method, MBE method and sublimation method, and liquid phase process such as flux method.

According to a preferred embodiment, the gallium nitride crystal layer is grown by flux method. In this case, the kind of the flux is not particularly limited, as far as it is possible to grow gallium nitride crystal. According to a preferred embodiment, it is used a flux containing at least one of an alkali metal and alkaline earth metal, and flux containing sodium metal is particularly preferred.

A gallium raw material is mixed to the flux and used. As the gallium raw material, gallium single metal, a gallium alloy and a gallium compound are applicable, and gallium single metal is suitably used from the viewpoint of handling.

The growth temperature of the gallium nitride crystal in the flux method and the holding time during the growth are not particularly limited, and they are appropriately modified in accordance with a composition of the flux. As an example, when the gallium nitride crystal is grown using a flux containing sodium or lithium, the growth temperature may be preferably set at 800° C. to 950° C., and more preferably set at 800 to 900° C.

According to flux method, a single crystal is grown in an atmosphere containing nitrogen-containing gas. For this gas, nitrogen gas may be preferably used, and ammonia may be used. The total pressure of the atmosphere is not particularly limited; but it may be preferably set at 3 MPa or higher, and further preferably 4 MPa or higher, from the standpoint of prevention against the evaporation of the flux. However, as the pressure is high, an apparatus becomes large. Therefore, the total pressure of the atmosphere may be preferably set at 7 MPa or lower, and further preferably 5 MPa or lower. Any other gas except the nitrogen-containing gas in the atmosphere is not limited; but an inert gas may be preferably used, and argon, helium, or neon may be particularly preferred.

Example of Controlling Peak Intensities of Cathode Luminescence

Here, it is described further the control of cathode luminescence on the surface of the gallium nitride substrate.

Figure 2A:
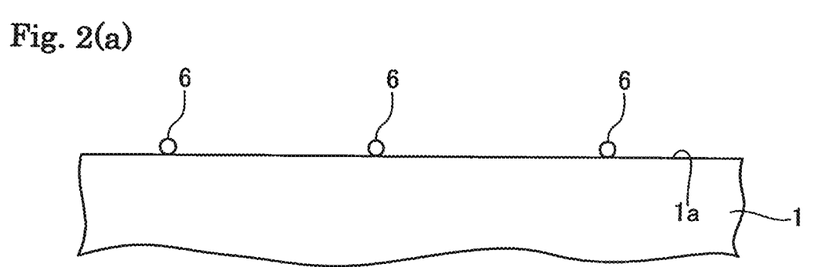
FIG. 2(a) is a view schematically showing nuclei 6 generated on the seed crystal 1.
Figure 2B:
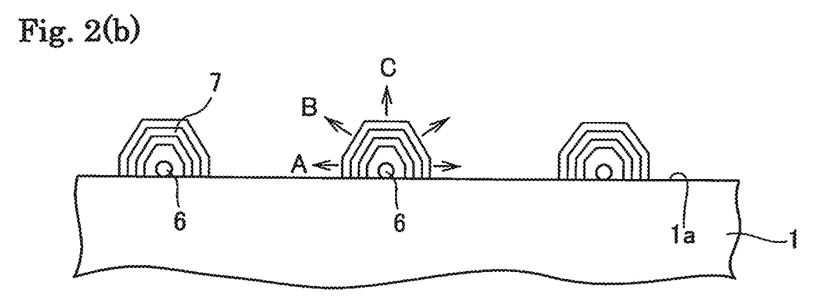
FIG. 2(b) is a view schematically showing growth direction from the nuclei 6.

For example, as shown in FIG. 2(a), as melt is contacted with the surface 1a of the gallium nitride substrate 1, nuclei are generated on the surface 1a as indicated by 6. Then, as shown in FIG. 2(b), crystal is grown starting from the nuclei 6. At this time, for example, the crystal is grown horizontally as an arrow "A", then grown perpendicularly with respect to the surface of the seed crystal as an arrow "C" and then grown diagonally as an arrow "B".

Here, at the time of generation of the nuclei, it is preferred that the nuclei are dispersed and distributed on the surface $1a$ of the seed crystal 1. Further, it is preferred that the density of the nuclei is small and a predetermined space is provided between the adjacent nuclei 6. In the case that the nuclei 6 are too close to each other at this time, it is concerned that crystals 7 grown from the adjacent nuclei interfere with each other to prevent the generation of the cathode luminescence distribution described below during the subsequent crystal growth.

On the viewpoint, it is preferred that the generation of the nuclei in the initial stage of growth is made mild and a number of the nuclei 6 is lowered, by elevating the growth temperature and/or by lowering the atmospheric pressure in the initial stage in flux method. According to a particularly preferred embodiment, the growth temperature in the initial stage of growth may preferably be 890 to 870° C. Further, the atmospheric pressure in the initial stage of growth may preferably be 3.5 to 4.0 Pa.

Further, in the initial stage of growth, it is preferably be held for 1 hour or longer, and more preferably be held for 2 hours or longer, under the high temperature and/or low pressure condition. It is thereby possible to sufficiently dissolve nitrogen in the melt.

Then, the growth temperature is lowered and/or the atmospheric pressure is elevated to facilitate the crystal growth. The growth temperature in this crystal growth stage may preferably be lower by 10° C. or more, and more preferably be lower by 20° C. or more, than the growth temperature in the initial stage. Further, as the growth temperature is too low, the growth rate is rather lowered. The growth temperature may preferably be 850° C. or higher and more preferably be 860° C. or higher. Further, the atmospheric pressure in this crystal growth stage may preferably be higher by 0.2 MPa or more, and more preferably be higher by 0.5 MPa or more, than the atmospheric pressure in the initial stage.

In the initial stage, by applying high temperature and/or lower pressure condition as described above, the supersaturation degree of the melt is lower, so that the crystal hardly grows and the crystal nuclei are rare and low in number. In the subsequent growth stage, starting from the nuclei, due to the high supersaturation degree, the growth rate in lateral direction is elevated as shown in an arrow "A" in FIG. $2(b)$ and dislocations are bent laterally. At the same time, in a part over the nuclei 6, the defect density becomes small and, although the reasons are unclear, an amount of incorporated impurities is increased so that light emission of impurity band is increased according to fluorescence microscope and light emission intensity is elevated according to CL observation. It is proved that this is considerable in the diagonally grown portion as shown in the arrow "B".

Further, for controlling the carrier concentration (conductive property) of the gallium nitride crystal, it is preferred to add a dopant. As the dopant element, germanium and oxygen may be exemplified.

Figure 3A:
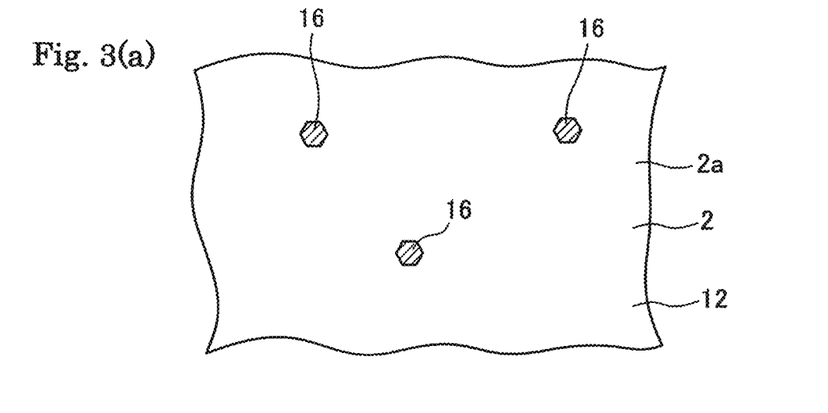
FIG. 3(a) schematically shows distribution of cathode luminescence peak intensities before polishing, and FIG. 3(b) schematically shows distribution of cathode luminescence peak intensities after the polishing. Further, FIG. 3(c) schematically shows island-shaped region each having a shape substantially of a parallelogram after the polishing.
Figure 3B:
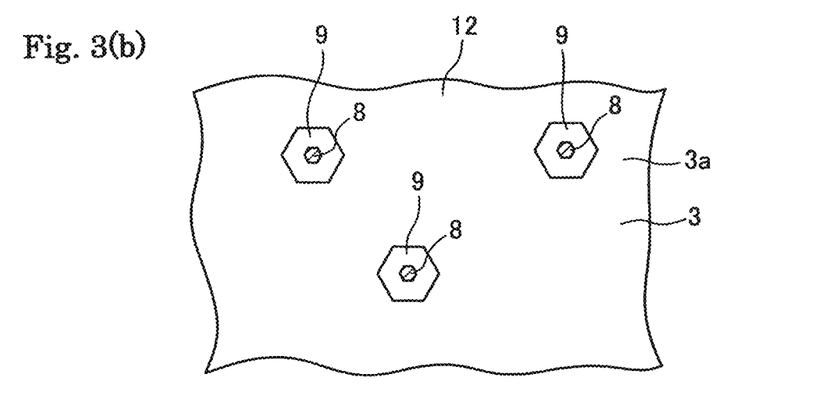
Figure 4:
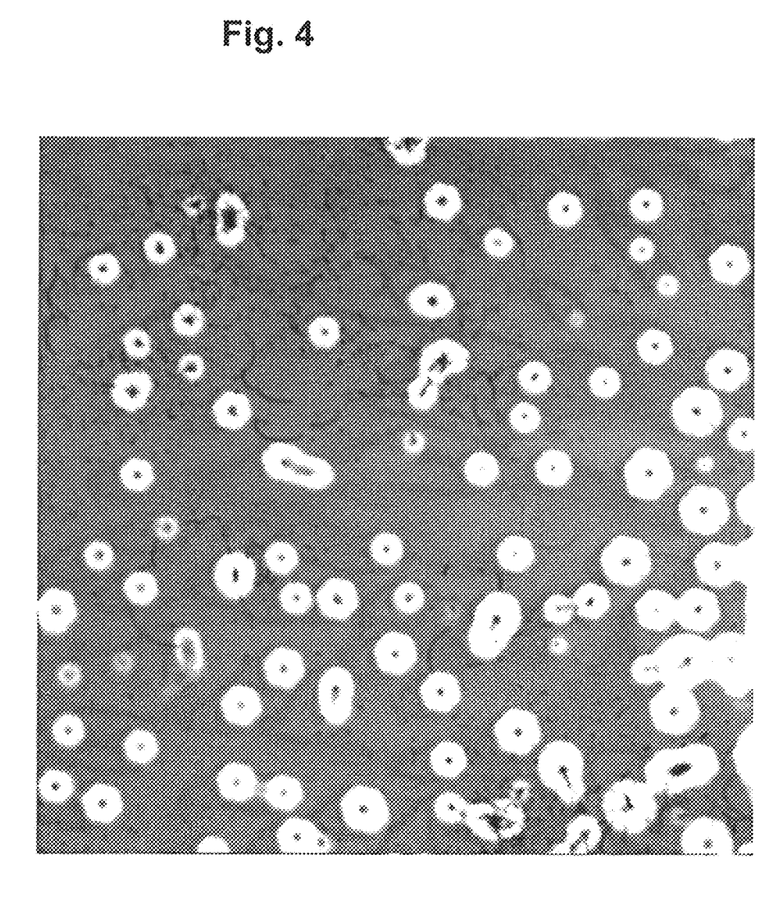
FIG. 4 is a photograph showing cathode luminescence image of the surface of the gallium nitride substrate after the polishing in example 1.

Here, in the grown gallium nitride layer, particularly in the case that the growth thickness exceeds 100 μm, as shown in FIG. $3(a)$, it was found that a region 16 tends to occur in dispersed state within a continuous phase (matrix) 12, on the surface of the gallium nitride layer 2, and the cathode luminescence peak intensity of such region 16 is lower than that of the continuous phase 12, meaning that the region 16 is darker than the continuous phase. Such state is shown in FIG. 4, for example. Such region 16 having the cathode luminescence peak intensity lower than that of the surrounding continuous phase is probably derived from the region formed direct over the nuclei 6 shown in FIG. 2. According to such state, the maximum value of the cathode luminescence peak intensities does no considerably exceed the average value.

Figure 5:
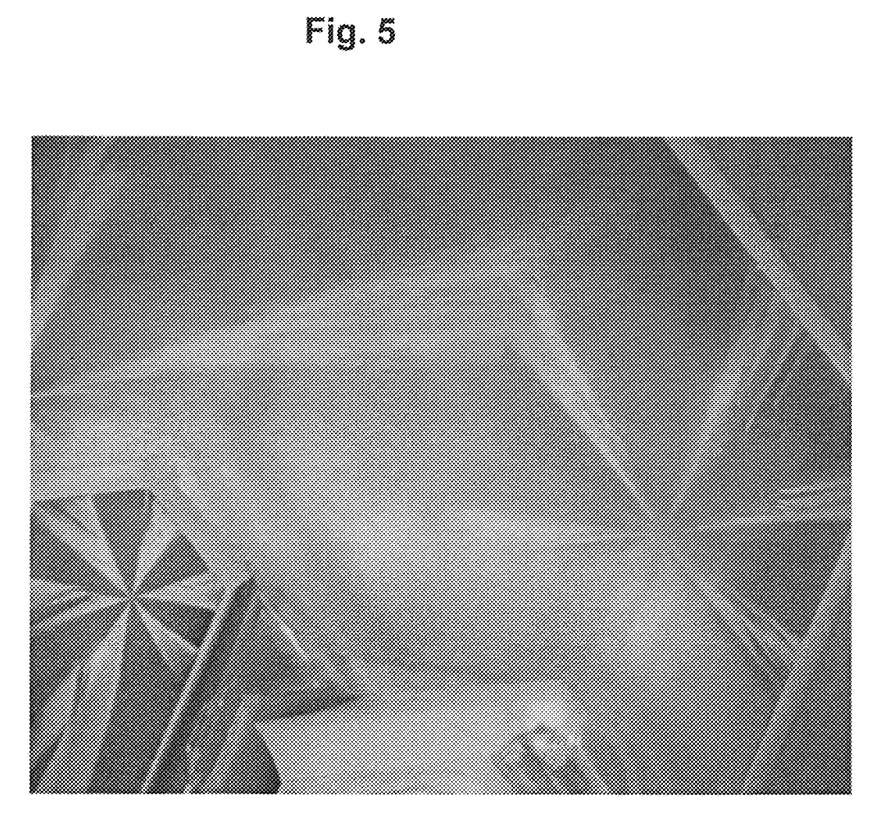
FIG. 5 is a photograph showing fluorescence microscopic image of the surface of the gallium nitride substrate before the polishing in example 2.
Figure 7:
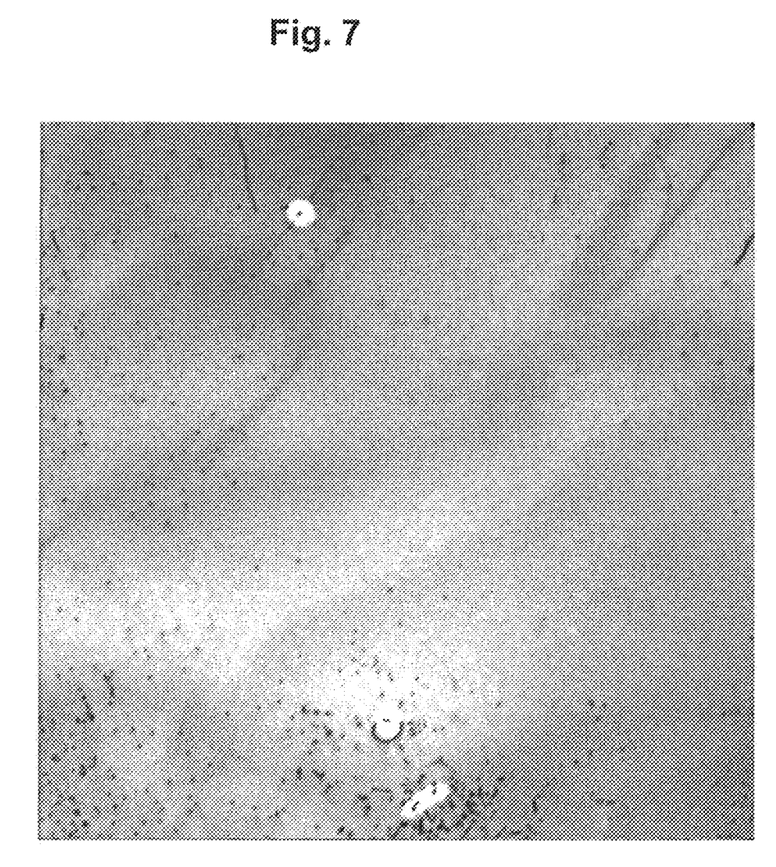
FIG. 7 is a photograph showing cathode luminescence image of the surface of the gallium nitride substrate after the polishing in example 3.

Then, the surface $2a$ of such gallium nitride layer is subjected to polishing treatment, as shown in FIG. $3(b)$, on the surface $3a$ of the gallium nitride layer 3 after the polishing, it is generated a region 9 having a cathode luminescence peak intensity higher than that of the surrounding continuous phase 12. It is considered that the crystal grown diagonally, as shown in the arrow "B" shown in FIG. $2(b)$, is exposed to the surface as the polishing is progressed. Around the center of the region 9 having the higher cathode luminescence peak intensity, a region 8 of lower peak intensity (observed as darker region) is usually present in many times. It is considered to be crystal grown directly over the nuclei. Various kinds of elements are incorporated in the crystal of the region 9 diagonally grown to provide light emission of impurity band, so that the cathode luminescence peak intensity is elevated. Such pattern is shown in FIGS. 5 and 7, for example. In the darker region 8, the maximum value of the peak intensities of the cathode luminescence is lower than 140 percent of the average value of the peak intensities of said cathode luminescence. When measured on the surface $3a$, the maximum value of peak intensities of cathode luminescence in a measured visual field of 0.1 mm×0.1 mm is 140 percent or higher of an average value of the peak intensities of the cathode luminescence, and the minimum value and maximum value of the photoluminescence peak intensities in the measurement region are 60 percent or lower and 120 percent or higher of an average value of the photoluminescence peak intensities, respectively.

Figure 3C:
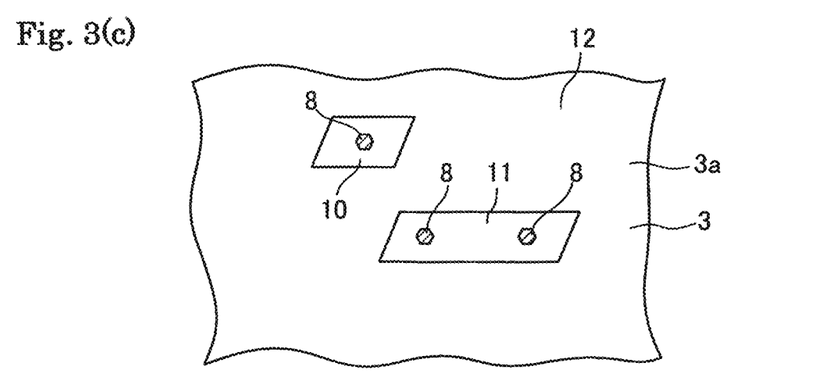

Such region having a high cathode luminescence peak intensities usually has a shape of substantially hexagonal due to the direction of the growth, However, in some occasions, the region of substantially hexagonal may be deformed to provide a region 10 substantially having a shape of a parallelogram, as shown in FIG. $3(c)$. Further, in the case that a space between the substantially hexagonal regions is relatively small, two or more regions may be connected to each other, so that a region 11 having a shape substantially of a parallelogram may be generated.

In rotating a growth container during the growth, the rotation of the growth container may be inverted or it is rotated in a single direction. In the ease that the container is rotated in the single direction, the rotational rate is set at 10 to 30 rpm, for example. In the case that the rotation of the container is inverted, the rotational rate is set at 10 to 30 rpm, for example.

Further, the rotation of the growth container may preferably be stopped. In this case, the time period for stopping the rotation may preferably be 100 seconds to 6000 seconds and more preferably be 600 seconds to 3600 seconds. Further, the time periods for rotation and rotational rates before and after the stopping of the rotation may preferably be 10 seconds to 600 seconds and 10 to 30 rpm, respectively.

Further, a ratio (molar ratio) of the nitride of a group 13 element/flux (for example, sodium) in the melt may preferably be made higher, preferably be 18 mol % or higher and more preferably be made 25 mol % or higher, on the viewpoint of the present invention. However, as this ratio becomes too high, the crystal quality tends to be deterioration, so that the ratio may preferably be 40 mol % or lower.

Processing and Shape of GaN Substrate

According to a preferred embodiment, the GaN substrate has a shape of a circular plate, and it may have another shape such as a rectangular plate. Further, according to a preferred embodiment, the dimension of the gallium nitride substrate is of a diameter φ of 25 mm or larger. It is thereby possible to provide the gallium nitride substrate which is suitable for the mass production of functional devices and easy to handle.

It will be described as to the case that the surface of the gallium nitride substrate is subjected to grinding and polishing.

Grinding is that an object is contacted with fixed abrasives, obtained by fixing the abrasives by a bond and rotating at a high rotation rate, to grind a surface of the object. By such grinding, a roughed surface is formed. In the case that a bottom face of a gallium nitride substrate is ground, it is preferably used the fixed abrasives containing the abrasives, composed of SiC. $Al_2O_3$, diamond, CBN (cubic boron nitride, same applies below) or the like having a high hardness and having a grain size of about 10 μm to 100 μm.

Further, lapping is that a surface plate and an object are contacted, while they are rotated with respect to each other, through free abrasives (it means abrasives which are not fixed, same applies below), or fixed abrasives and the object are contacted while they are rotated with respect to each other, to polish a surface of the object. By such lapping, it is formed a surface having a surface roughness smaller than that in the case of the grinding and larger than that in the case of micro lapping (polishing). It is preferably used abrasives composed of SiC. $Al_2O_3$, diamond, CBN or the like having a high hardness and having a grain size of about 0.5 μm or larger and 15 μm or smaller.

Micro lapping (polishing) means that a polishing pad and an object are contacted with each other through free abrasives while they are rotated with each other, or fixed abrasives and the object are contacted with each other while they are rotated with each other, for subjecting a surface of the object to micro lapping to flatten it. By such polishing, it is possible to obtain a crystal growth surface having a surface roughness smaller than that in the case of the lapping.

Functional Layer and Functional Device

The functional layer as described above may be composed of a single layer or a plurality of layers. Further, as the functions, it may be used as a white LED with high brightness and improved color rendering index, a blue-violet laser disk for high-speed and high-density optical memory, a power device for an inverter for a hybrid car or the like.

As a semiconductor light emitting diode (LED) is produced on the gallium nitride substrate by a vapor phase process, preferably by metal organic vapor phase deposition (MOCVD) method, the dislocation density inside of the LED can be made comparable with that of the gallium nitride substrate.

The film-forming temperature of the functional layer may preferably be 950° C. or higher, and more preferably be 1000° C. or higher, on the viewpoint of the film-formation rate. Further, on the viewpoint of preventing defects, the film-forming temperature of the functional layer may preferably be 1200° C. or lower and more preferably be 1150° C. or lower.

The material of the functional layer may preferably be a nitride of a group 13 element. Group 13 element means group 13 element according to the Periodic Table determined by IUPAC. The group 13 element is specifically gallium, aluminum, indium, thallium or the like. Further, as an additive, it may be listed carbon, a metal having a low melting point (tin, bismuth, silver, gold), and a metal having a high melting point (a transition metal such as iron, manganese, titanium, chromium). The metal having a low melting point may be added for preventing oxidation of sodium, and the metal having a high melting point may be incorporated from a container for containing a crucible, a heater of a growing furnace or the like.

The light emitting device structure includes, an n-type semiconductor layer, a light emitting region provided on the n-type semiconductor layer and a p-type semiconductor layer provided on the light emitting region, for example. According to the light emitting device 15 shown in FIG. 1(c), an n-type contact layer 5a, an n-type clad layer 5b, an activating layer 5c, a p-type clad layer 5d and a p-type contact layer 5e are formed on the gallium nitride substrate 4 to constitute the light emitting structure 5.

Further, the light emitting structure described above may preferably further include an electrode for the n-type semiconductor layer, an electrode for the p-type semiconductor layer, a conductive adhesive layer, a buffer layer and a conductive supporting body or the like not shown.

According to the light emitting structure, as light is emitted in the light emitting region through re-combination of holes and electrons injected through the semiconductor layers, the light is drawn through the side of a translucent electrode on the p-type semiconductor layer or the film of the nitride single crystal of the group 13 element. Besides, the translucent electrode means an electrode capable of transmitting light and made of a metal thin film or transparent conductive film formed substantially over the whole of the p-type semiconductor layer.

The n-type semiconductor layer or p-type semiconductor layer is composed of a semiconductor of III-V group compound semiconductor, which includes the followings.

$Al_yIn_xGa_{1-x-y}N$ (0.1≤x≤1, 0≤y≤1)

As a dopant for imparting n-type conductivity, silicon, germanium and oxygen are listed. Further, as a dopant for imparting p-type conductivity, magnesium and zinc are listed.

The method of growing each of the semiconductor layers constituting the light emitting structure includes various kinds of vapor phase growing methods. For example, metal organic chemical vapor deposition (MOCVD; MOVPE), molecular beam epitaxy (MBE), hydride vapor phase epitaxy (HYPE) or the like may be used. Among them, it is possible to obtain semiconductor layers with good crystallinity and flatness by MOCVD method. According to MOCVD method, an alkyl metal compound such as TMG (trimethyl gallium) and TEG (triethyl gallium) or the like is used as the Ga source in many cases and a gas such as ammonia and hydrazine are used as the nitrogen source.

The light emitting region includes a quantum well active layer. The material of the quantum well active layer is designed so that the band gap is made smaller than those of the n-type and p-type semiconductor layers. The quantum well active layer may be a single quantum well active layer (SQW) structure or a multi quantum well active layer (MQW) structure. The material of the quantum well active layer includes the followings.

As a preferred example of the quantum well active layer, it is listed an MQW structure including three to five periods of quantum well active layers each made of $Al_xGa_{1-x}N/Al_yGa_{1-y}N$ series with a film thickness of 3 nm/8 nm.

EXAMPLES

Example 1

The GaN substrate was produced according to the following procedure.

Specifically, it was prepared a self-supporting type seed crystal substrate 1 made of gallium nitride seed crystal whose in-plane distribution of dislocation density by CL (cathode luminescence) was $2 \times 10^8/cm^2$ in average excluding its outer periphery of 1 cm.

The gallium nitride substrate 1 was used to form a gallium nitride layer 2 by flux method. Specifically, Na and Ga were charged into a crucible, held at 870° C. and 4.0 MPa (nitrogen atmosphere) for 5 hours. Under such temperature and pressure conditions, it was proved that the supersaturation degree was low and the growth rate was very low as 0.5 μm/hr. Although it was grown about 2.5 μm after holding for 5 hours, the nuclei were rarely observed as described above and there were regions in part where the growth was hardly observed. Then, it was cooled to 850° C. for 10 minutes. Then, it was held at 4.0 MPa for 20 hours to grow the gallium nitride layer 2. It was used an alumina crucible and starting materials of Na:Ga=40 g:30 g. 1.85 g of tetrachlorogermanium was added as a dopant. The content of Ge with respect to Ga was 2.0 mol %. For agitating the solution, the rotational direction was changed to clockwise and anticlockwise directions per each 600 seconds. The rotational rate was made 30 rpm.

After the reaction, it was cooled to room temperature, and the flux was removed by the chemical reaction with ethanol to obtain the colorless and transparent gallium nitride layer 2 having a growth thickness of 250 μm. The average growth rate was about 12.5 μm/hr. An inclusion-containing layer was observed in a region of about 20 μm in the initial stage of growth. On the other hand, inclusions were not observed on the surface of the grown crystal. Based on this, it was considered that the growth rate was rapidly increased direct after the temperature drop. From the results of the preliminary test, it is considered that the growth rate was 20 μm/hr in the initial stage of growth.

Then, the surface 2a of the gallium nitride layer 2 was subjected to CMP polishing until the thickness became 50 μm, and thereafter, the in-plane distribution of the dislocation density was measured by CL to prove to be 3 to $4 \times 10^6/cm^2$. FIG. 4 shows an example of the CL image. It was observed a plularity of bright regions emitting light in the observed visual field. The outline of the region was substantially hexagonal. Further, within this region, a darker region was present. The CL image was subjected to image analysis in 8 bits (256 gradation) to calculate a ratio of the average gradation (Xave) and peak gradation (Xpeak), to prove that Xpeak/Xave was 1.9. That is, the maximum value of the cathode luminescence peak intensities was 190 percent of the average value.

Then, the photoluminescence peak intensities of the wavelength corresponding to the bandgap of gallium nitride was measured in each of the measurement regions each of 1 mm×1 mm in the measurement range on the surface of the gallium nitride substrate. The minimum value of the photoluminescence peak intensities in the whole measurement region was 45 percent of the average value and the maximum value was 140 percent of the average value. The distribution of photoluminescence peak intensities was more uniform than the distribution of intensities in the CL image.

Besides, the photoluminescence peak intensities are to be measured according to the descriptions of the examples of the patent document 2.

That is, by using a photoluminescence measuring system ("RPM2000" produced by ACCENT corporation), it was measured the photoluminescence peak intensities of the wavelength corresponding to the band gap of gallium nitride, for each of a plurality of the measurement regions on a Ga polar surface of the gallium nitride substrate. Here, the measurement range was made a region excluding an outer peripheral region of 1 mm from the outer edge of the gallium nitride substrate. The measurement region was made a square region of 1 mm×1 mm and the regions were continuously arranged in the measurement range.

The conditions for the photoluminescence measurement were as follows.
Laser light source: YAG laser of a wavelength of 266 nm
Width of light-receiving slit: 0.1 mm
Range of measured wavelength: 332.6 to 397.3 nm On the thus obtained gallium nitride substrate, a blue light LED film structure was formed and its light emitting characteristic was measured. The in-plane distribution of the light emitting intensities of the LED chip of 1 mm square showed good uniformity so that difference was not observed in the outer peripheral portion and central portion. Further, it was as high as 75 percent the ratio of chips having an optical output of 200 mW or higher in the light emitting characteristic at a driving current of 350 mA.

Example 2

The experiment was carried out as the example 1, except that the frequency of the inversion of the rotational direction for agitating solution was made 400 seconds. It was thus obtained a colorless and transparent crystal 4 having a growth thickness of 200 μm. The average growth rate was about 10 μm/hr. An inclusion-containing layer was observed in a region of about 15 μm in the initial stage of growth. On the other hand, inclusions were not observed on the surface of the grown crystal. For the reference, FIG. 5 shows a fluorescence microscopic image of a gallium nitride layer by liquid phase process at a thickness of 200 μm.

Figure 6:
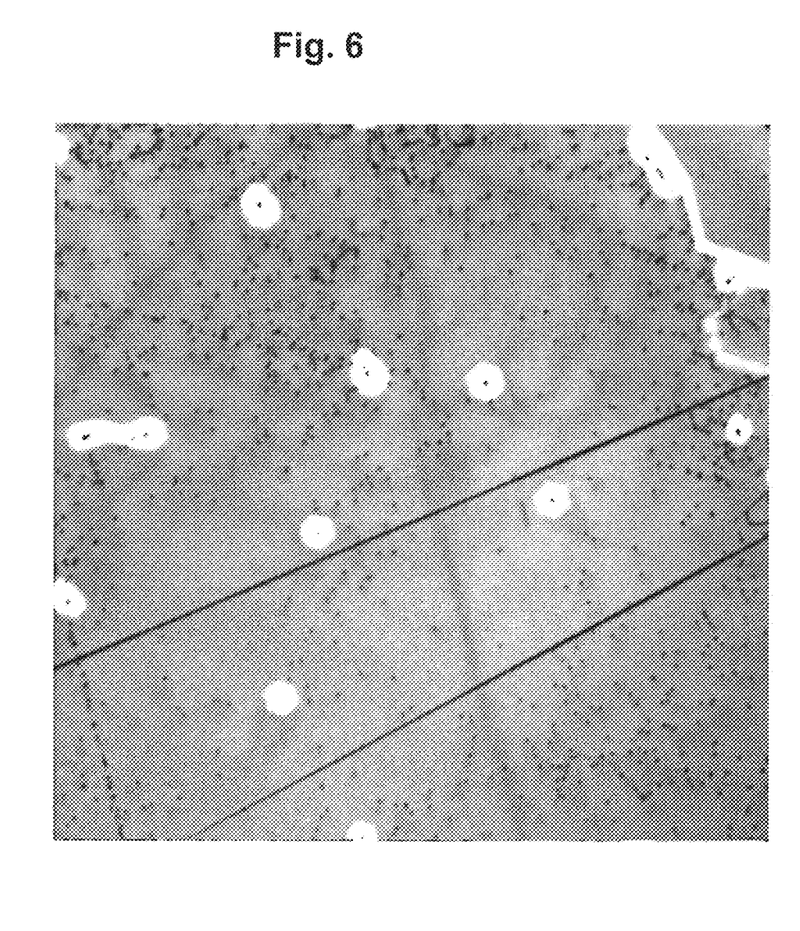
FIG. 6 is a photograph showing cathode luminescence image of the surface of the gallium nitride substrate after the polishing in example 2.

The surface of the thus obtained gallium nitride layer of liquid phase process was subjected to CMP polishing until the thickness became 50 μm, and thereafter, the in-plane distribution of the dislocation density was measured by CL to prove to be 4 to $5 \times 10^6/cm^2$. FIG. 6 shows an example of the CL image. It was observed a plurality of bright regions emitting light in the observed visual field. The outline of the region was substantially hexagonal. The thus obtained CL image was subjected to image analysis in 8 bits (256 gradation) to calculate a ratio of the average gradation (Xave) and peak gradation (Xpeak), to prove that Xpeak/Xave was 1.6. That is, the maximum value of the cathode luminescence peak intensities was 160 percent of the average value.

Then, the photoluminescence peak intensities of the wavelength corresponding to the band gap of gallium nitride was measured as the Example 1. As a result, the minimum value of the photoluminescence peak intensities in the whole measurement region was 50 percent of the average value and the maximum value was 140 percent of the average value.

The distribution of photoluminescence peak intensities was more uniform than the distribution of intensities in the CL image.

On the substrate, a blue light LED film structure was formed and its light emitting characteristic was measured. The in-plane distribution of the light emitting intensity of the LED chip of 1 mm square showed good uniformity so that difference was not observed in the outer peripheral portion and central portion. Further, it was as high as 70 percent the ratio of chips having an optical output of 200 mW or higher in the light emitting characteristic at a driving current of 350 mA.

Example 3

The experiment was carried out as the example 1, except that the frequency of the inversion of the rotational direction for agitating solution was made 300 seconds. It was thus obtained a colorless and transparent crystal 2 having a growth thickness of 160 μm. The average growth rate was about 8 μm/hr. An inclusion-containing layer was observed in a region of about 15 μm in the initial stage of growth. On the other hand, inclusions were not observed on the surface of the grown crystal.

The surface of the thus obtained gallium nitride layer 2 of liquid phase process was subjected to CMP polishing until the thickness became 50 μm, and thereafter the in-plane distribution of the dislocation density was measured by CL to prove to be 4 to $5 \times 10^6/cm^2$. FIG. 7 shows an example of the CL image. It was observed a plurality of bright regions emitting light in the observed visual field. The outline of the region had a shape substantially of a hexagonal or a parallelogram, as can be seen from the figure. The CL image was subjected to image analysis in 8 bits (256 gradation) to calculate a ratio of the average gradation (Xave) and peak gradation (Xpeak), to prove that Xpeak/Xave was 1.4. That is, the maximum value of the cathode luminescence peak intensities was 140 percent of the average value.

Then, the photoluminescence peak intensities of the wavelength corresponding to the band gap of gallium nitride was measured as the Example 1. As a result, the minimum value of the photoluminescence peak intensities in the whole measurement region was 60 percent of the average value and the maximum value was 120 percent of the average value. The distribution of photoluminescence peak intensities was more uniform than the distribution of intensities in the CL image.

On the thus obtained gallium nitride substrate, a blue light LED film structure was formed and its light emitting characteristic was measured. The in-plane distribution of the light emitting intensity of the LED chip of 1 mm square showed good uniformity so that difference was not observed in the outer peripheral portion and central portion. Further, it was as high as 70 percent the ratio of chips having an optical output of 200 mW or higher in the light emitting characteristic at a driving current of 350 mA.

Comparative Example

The experiment was carried out as the example 1, except that the frequency of the inversion of the rotational direction for agitating solution was made 3600 seconds. It was thus obtained a colorless and transparent gallium nitride layer 2 having a growth thickness of 120 μm. The average growth rate was about 6 μm/hr. An inclusion-containing layer was not observed in a region in the initial stage of growth. On the other hand, inclusions were not observed on the surface of the grown crystal The surface of the thus obtained gallium nitride layer of liquid phase process was subjected to CMP polishing until the thickness became 50 μm, and thereafter, the in-plane distribution of the dislocation density was measured by CL to prove that 5 to $7 \times 10^6/cm^2$. FIG. 9 shows an example of the CL image. It was not observed a bright region emitting light and only dark spots were observed in the observed visual field. The CL image was subjected to image analysis in 8 bits (256 gradation) to calculate a ratio of the average gradation (Xave) and peak gradation (Xpeak), to prove that Xpeak/Xave was 1.1. That is, the maximum value of the cathode luminescence peak intensities was 110 percent of the average value.

Figure 8:
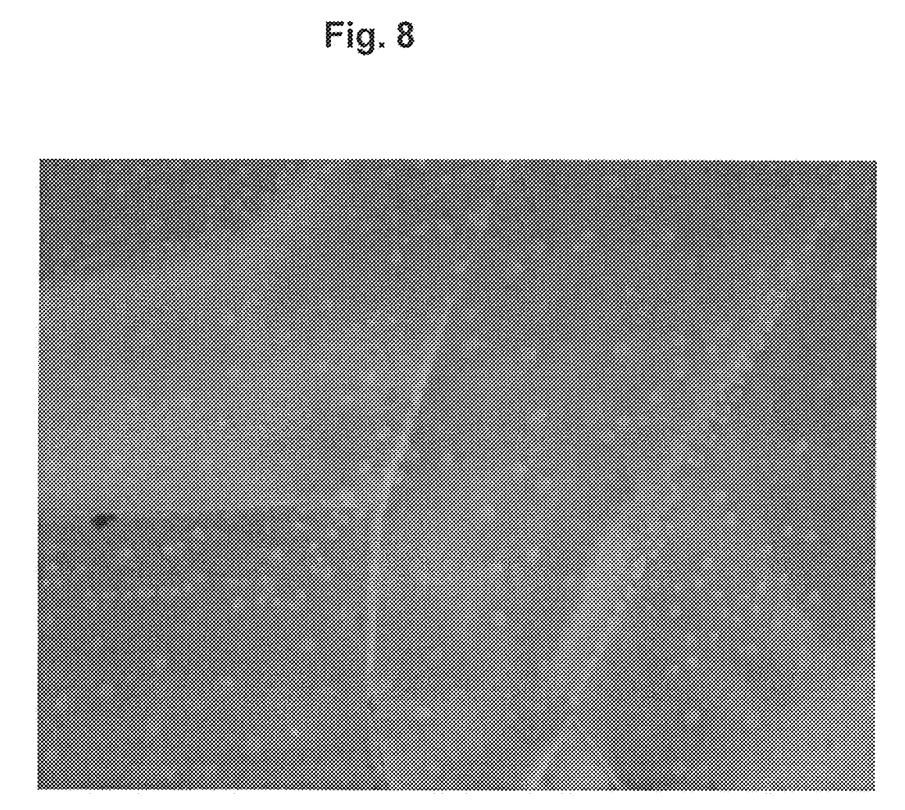
FIG. 8 is a photograph showing fluorescence microscopic image of the surface of the gallium nitride substrate in comparative example.

Besides, FIG. 8 is a photograph showing a fluorescence microscopic image of the surface of the gallium nitride substrate.

Then, the photoluminescence peak intensities were measured in the whole measurement region as the example 1. The minimum value was 90 percent of the average value and the maximum value was 110 percent of the average value. The distribution of the photoluminescence peak intensities was substantially comparable with the distribution of the intensities of the CL image.

On the substrate, a blue light LED film structure was formed and its light emitting characteristic was measured. The in-plane distribution of the light emitting intensities of the LED chip of 1 mm square showed poor uniformity and it was rarely observed regions of a low light emission intensity. Further, the ratio of chips, having an optical output of 200 mW or higher in the light emitting characteristic at a driving current of 350 mA, was 50 percent, which was significantly lower than that in the examples. It was invested leak current characteristic of chips having a low optical output to confirm the generation of leak current from the region of a low voltage. It was proved that the low optical output was due to the leak current.

The invention claimed is:

1. A gallium nitride substrate, wherein a maximum value of peak intensities of cathode luminescence in a measured visual field of 0.1 mm×0.1 mm is 140 percent or higher of an average value of said peak intensities of said cathode luminescence, provided that said peak intensities of said cathode luminescence are of a wavelength corresponding to a band gap of gallium nitride and are measured on a surface of said gallium nitride substrate.

2. The gallium nitride substrate of claim 1, comprising island-shaped regions distributed on said surface of said gallium nitride substrate, wherein the maximum value of said peak intensities of said cathode luminescence is 140 percent or higher of said average value of said peak intensities of said cathode luminescence in said island-shaped region.

3. The gallium nitride substrate of claim 2, wherein said island-shape region has an outer profile of a shape substantially of a hexagonal or a parallelogram.

4. The gallium nitride substrate of claim 2, further comprising a region, surrounded by an outer profile of said island-shaped region and in which the maximum value of said peak intensities of said cathode luminescence is lower than 140 percent of said average value of said peak intensities of said cathode luminescence.

5. The gallium nitride substrate of claim 1, provided that photoluminescence peak intensities of said wavelength corresponding to said band gap of gallium nitride are measured in each of measurement regions each having a shape of a square of 1 mm×1 mm in a measurement range on said surface of said gallium nitride substrate, and provided that said measurement regions are continuous in said measurement range without intervening spaces,
  wherein a minimum value and maximum value of said photoluminescence peak intensities in said measurement region are 60 percent or lower and 120 percent or higher of an average value of said photoluminescence peak intensities in said measurement region, respectively.

6. The gallium nitride substrate of claim 5, wherein said measurement range comprises a region excluding a region having a width of 1 mm from an outer periphery of said surface of said gallium nitride substrate.

7. A functional device comprising said gallium nitride substrate of claim 1 and a functional layer formed on said surface of said gallium nitride substrate and comprising a nitride of a group 13 element.

8. The functional device of claim 7, wherein said functional layer has a function of emitting light.

* * * * *